(12) United States Patent
Konishi (10) Patent No.: US 12,061,226 B2
(45) Date of Patent: Aug. 13, 2024

(54) SUPPORT DEVICE, TEST SYSTEM, AND METHOD OF CONTROLLING SUPPORT DEVICE

(71) Applicant: Tokyo Electron Limited, Tokyo (JP)

(72) Inventor: Kentaro Konishi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 133 days.

(21) Appl. No.: 17/937,822

(22) Filed: Oct. 4, 2022

(65) Prior Publication Data

US 2023/0119110 A1    Apr. 20, 2023

(30) Foreign Application Priority Data

Oct. 14, 2021   (JP) ................................ 2021-169106

(51) Int. Cl.
*G01R 31/28*    (2006.01)

(52) U.S. Cl.
CPC ................................ *G01R 31/2875* (2013.01)

(58) Field of Classification Search
CPC ............ G01R 31/2875; G01R 31/2874; G01R 31/2831; G01R 31/2868; H01L 21/67103; H01L 21/67167; H01L 21/67242; H01L 21/681; H01L 21/68707; H01L 21/68714; H05B 1/0202; H05B 1/023
See application file for complete search history.

(56) References Cited

U.S. PATENT DOCUMENTS

| | | | |
|---|---|---|---|
| 2018/0330928 A1* | 11/2018 | Mertke | H01J 37/32724 |
| 2018/0366303 A1* | 12/2018 | Tsuda | H01L 21/02063 |
| 2020/0264510 A1* | 8/2020 | Liao | G03F 7/094 |
| 2022/0065920 A1* | 3/2022 | Lee | G01R 31/2867 |

FOREIGN PATENT DOCUMENTS

JP    2019-029627    2/2019

* cited by examiner

*Primary Examiner* — Jermele M Hollington
*Assistant Examiner* — Zannatul Ferdous
(74) *Attorney, Agent, or Firm* — IPUSA, PLLC (57) ABSTRACT

A support device includes a support that supports an object to be tested and that includes a flow path inside, the flow path having an inlet and an outlet, and the flow path being configured to flow a first temperature adjusting medium from the inlet to the outlet, a mixer configured to discharge a third temperature adjusting medium, the first temperature adjusting medium flowing out from the outlet and a second temperature adjusting medium externally supplied being mixed at a ratio that is predetermined in the third temperature adjusting medium, a medium transfer configured to transfer the third temperature adjusting medium to the inlet as the first temperature adjusting medium, and a heater configured to heat the first temperature adjusting medium or the third temperature adjusting medium.

10 Claims, 9 Drawing Sheets

SUPPORT DEVICE, TEST SYSTEM, AND METHOD OF CONTROLLING SUPPORT DEVICE

CROSS-REFERENCE TO RELATED APPLICATIONS

This patent application is based on and claims priority to Japanese Patent Application No. 2021-169106 filed on Oct. 14, 2021, the entire contents of which are incorporated herein by reference.

TECHNICAL FIELD

The present disclosure relates to a support device, a test system, and a method of controlling the support device.

BACKGROUND

For example, Patent Document 1 discloses a test system including multiple test rooms each accommodating a tester configured to perform an electrical test on an object to be tested on a stage. Patent Document 1 discloses that the test system includes a refrigerant supply configured to supply a refrigerant to a stage, and multiple refrigerant pipes extending from the refrigerant supply to respective test rooms.

RELATED ART DOCUMENT

Patent Document

[Patent Document 1] Japanese Laid-open Patent Application Publication No. 2019-029627

SUMMARY

According to one aspect of the present disclosure, a support device includes a support that supports an object to be tested and that includes a flow path inside, the flow path having an inlet and an outlet, and the flow path being configured to flow a first temperature adjusting medium from the inlet to the outlet, a mixer configured to discharge a third temperature adjusting medium, the first temperature adjusting medium flowing out from the outlet and a second temperature adjusting medium externally supplied being mixed at a ratio that is predetermined in the third temperature adjusting medium, a medium transfer configured to transfer the third temperature adjusting medium to the inlet as the first temperature adjusting medium, and a heater configured to heat the first temperature adjusting medium or the third temperature adjusting medium.

DETAILED DESCRIPTION OF EMBODIMENTS

In the following, embodiments of the present disclosure will be described with reference to the drawings. In the present specification and the drawings, the substantially identical structures are referenced by the same reference numerals, and overlapped description is omitted.

<Overall Configuration of a Test System>

Figure 1:
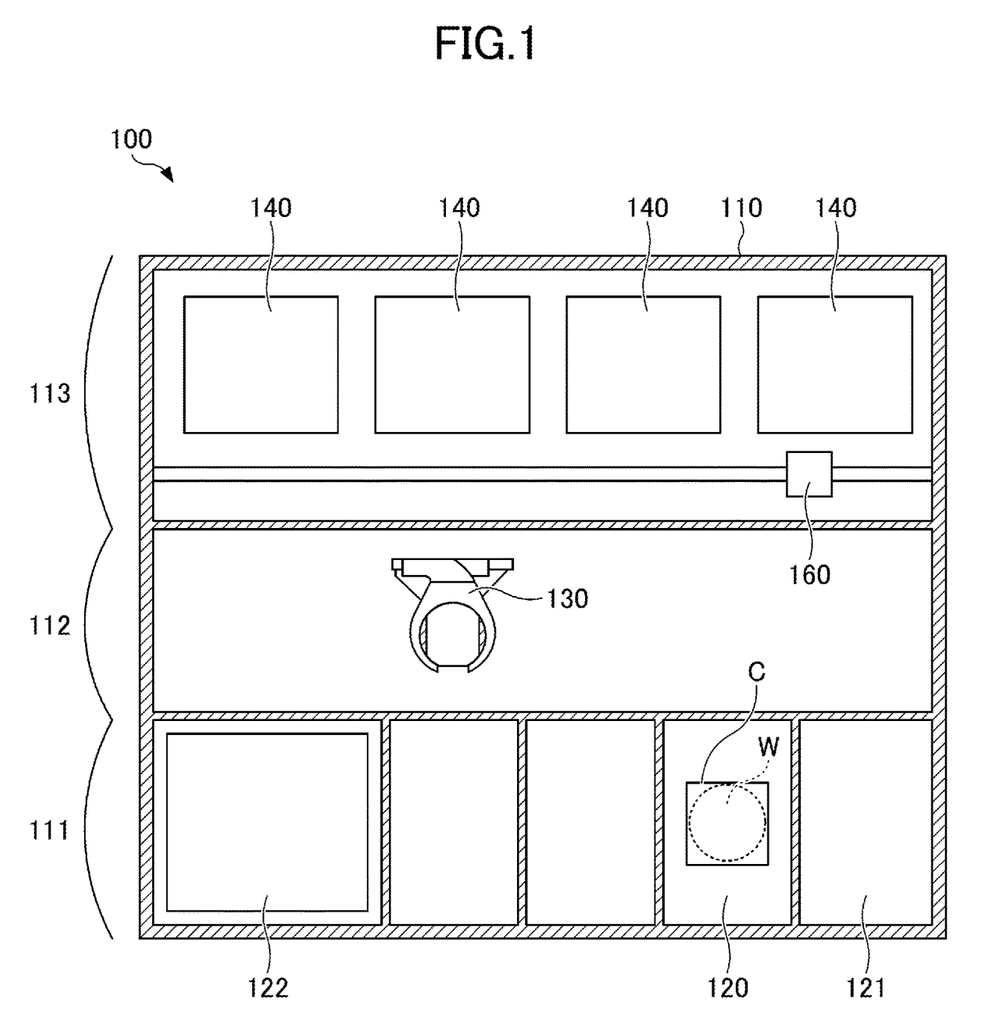
FIG. 1 is a top horizontal cross-sectional view schematically illustrating a configuration of a test system according to the present embodiment.
Figure 2:
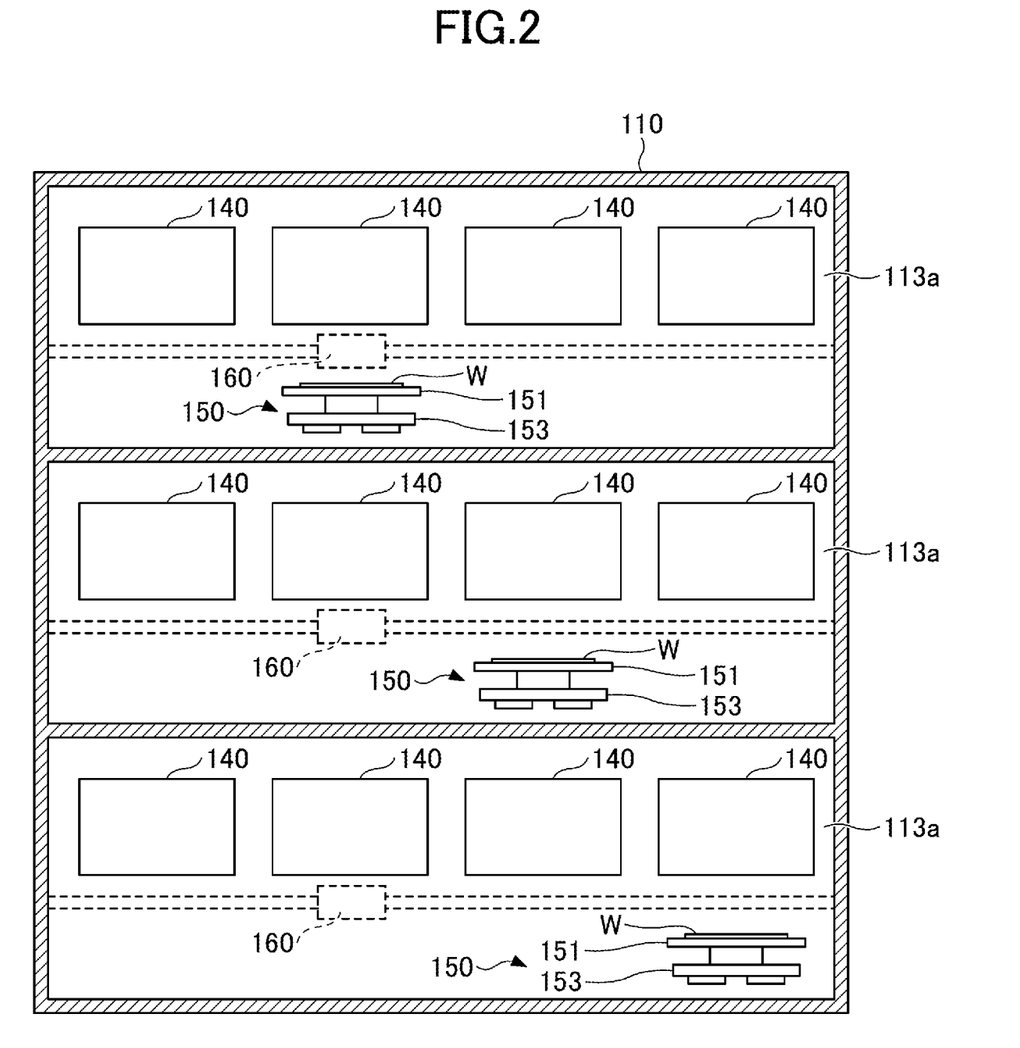
FIG. 2 is a front vertical cross-sectional view schematically illustrating the configuration of the test system according to the present embodiment.

FIG. 1 is a top horizontal cross-sectional view schematically illustrating a configuration of a test system 100 according to the present embodiment. FIG. 2 is a front vertical cross-sectional view schematically illustrating the configuration of the test system 100 according to the present embodiment.

The test system 100, which is a device that tests electrical characteristics based on a temperature set for each substrate W (an example of a substrate) includes a housing 110. The inside of the housing 110 is divided into a carry-in/out area 111, a transfer area 112, and a test area 113.

The carry-in/out area 111 is an area for carrying the substrate W to be tested into the test system 100 and for carrying the tested substrate W out of the test system 100. Additionally, the carry-in/out area 111 is an area for carrying a probe card 180, which will be described later, in the test system 100 and out of the test system 100. The carry-in/out area 111 is provided with a port 120 for receiving a cassette C accommodating multiple substrates W and a loader 121 for accommodating the probe card 180, which will be described later. Additionally, the carry-in/out area 111 is provided with a controller 122 that controls each component of the test system 100.

The transfer area 112 is an area for transferring the substrate W or the like between the carry-in/out area 111 and the test area 113. In the transfer area 112, a transfer device 130 that can move freely while holding the substrate W or the like is disposed. The transfer device 130 transfers the substrate W between the cassette C in the port 120 of the carry-in/out area 111 and an aligning unit 150 of the test area 113, which will be described later. Additionally, the transfer device 130 transfers, to a loader 121 in the carry-in/out area 111, a probe card 180 that requires maintenance among the probe cards 180 fixed to a pogo frame 170, which will be described later, in the test area 113. Further, the transfer device 130 transfers a new probe card 180 or the probe card 180 on which maintenance has been performed, from the loader 121 to the pogo frame 170 in the test area 113.

The test area 113 is an area where the electrical characteristics of an electronic device formed on the substrate W are tested. The test area 113 is provided with multiple testers 140 as testers. Specifically, as illustrated in FIG. 2, the test area 113 is divided into three areas in the vertical direction, and in each divided area 113a, a tester row including four testers 140 horizontally arranged as illustrated in FIG. 2 is provided. Additionally, in each divided area 113a, one aligning unit 150 and one camera 160 are provided. Here, the number and arrangement of the testers 140, the aligning units 150, and the cameras 160 can be suitably selected. The tester 140 transmits and receives an electrical signal for an electrical characteristic test to and from the substrate W.

The aligning unit 150 includes a chuck top 151 and an aligner 153. The chuck top 151 and the aligner 153 will be described in detail later. The substrate W is placed on the aligning unit 150. Additionally, the aligning unit 150 aligns the placed substrate W with the probe card 180 disposed below the tester 140. The aligning unit 150 is provided such that the aligning unit 150 can move in an area below the tester 140 for alignment.

The camera 160 captures images of the positional relationship between the probe card 180 disposed below the tester 140 and the substrate W placed on the aligning unit 150. The camera 160 is provided such that the camera 160 is horizontally moved and positioned in front of each tester 140 in the divided area 113a in which the camera 160 is provided.

In the test system 100 according to the present embodiment, while the transfer device 130 transfers the substrate W toward one tester 140 among the multiple testers 140 in the divided area 113a, another tester 140 in the divided area 113a can test the electrical characteristics of another device formed on another substrate W.

Figure 3:
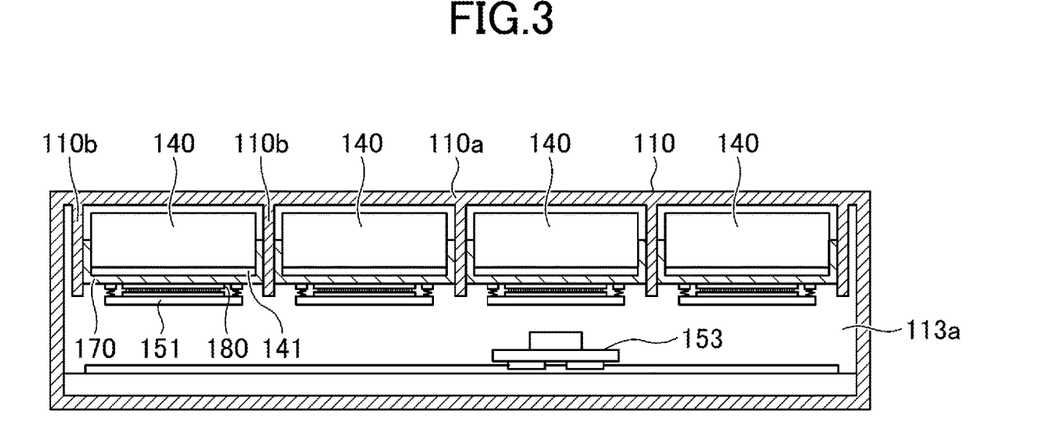
FIG. 3 is a front vertical cross-sectional view illustrating a configuration of a test area of the test system according to the present embodiment.
Figure 4:
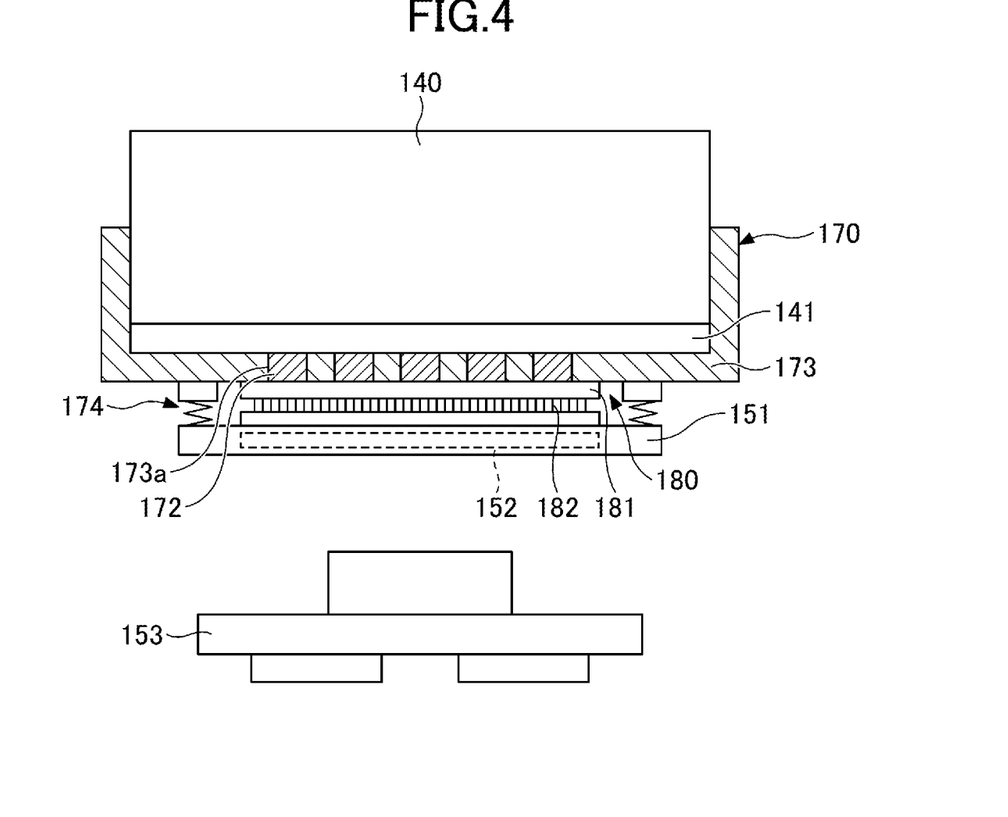
FIG. 4 is a partially enlarged view illustrating a tester of the test system according to the present embodiment in detail.

Next, with reference to FIG. 3 and FIG. 4, the configurations of the tester 140, the aligning unit 150, and their related components will be described in detail. FIG. 3 is a front vertical cross-sectional view illustrating the configuration of the test area 113 of the test system 100 according to the present embodiment. FIG. 4 is a partially enlarged view illustrating the tester 140 of the test system 100 according to the present embodiment in detail.

As illustrated in FIG. 3 and FIG. 4, the tester 140 includes a tester motherboard 141 provided horizontally at the bottom of the tester 140. Multiple test circuit boards (not illustrated) are mounted on the tester motherboard 141 in an erected state. Additionally, multiple electrodes are provided on the bottom surface of the tester motherboard 141.

Further, one pogo frame 170 and one probe card 180 are provided below the tester 140 in this order from the upper side.

Around the tester 140, multiple support walls 110b are provided extending vertically downward from the upper wall 110a of the divided area 113a. The pogo frame 170 is attached to the lower portions of the opposing support walls 110b. Each tester 140 is supported by the opposing support walls 110b and the pogo frame 170 attached between the support walls 110b.

The pogo frame 170 supports the probe card 180 and electrically connects the probe card 180 to the tester 140. The pogo frame 170 is disposed between the tester 140 and the probe card 180. The pogo frame 170 has pogo pins that electrically connect the tester 140 to the probe card 180. Specifically, the pogo frame 170 has a pogo block 172 that holds a large number of pogo pins, and a frame body 173 formed with a mounting hole 173a into which the pogo block 172 is inserted to mount the pogo pins.

The probe card 180 is vacuum-suctioned to the lower surface of the pogo frame 170 in a state of being aligned at a predetermined position.

Additionally, a bellows 174 extending vertically downward is attached to the lower surface of the pogo frame 170 so as to surround the attachment position of the probe card 180. A sealed space including the probe card 180 and the substrate W is formed by the bellows 174. In the sealed space, the substrate W on the chuck top 151, which will be described later, is in contact with probes 182 of the probe card 180, which will be described later.

Additionally, a vacuum suction force acts on the pogo frame 170 and the probe card 180 by a vacuum mechanism (not illustrated). By the vacuum suction force, the lower end of each pogo pin of the pogo frame 170 comes in contact with the corresponding electrode pad on the upper surface of the card body 181 of the probe card 180, which will be described later. Additionally, the upper end of each pogo pin of the pogo frame 170 comes in contact with the corresponding electrode on the lower surface of the tester motherboard 141 by the vacuum suction force.

The probe card 180 includes a disk-shaped card body 181, multiple electrode pads (not illustrated) provided on the upper surface of the card body 181, and the probes 182, which are multiple needle-shaped terminals extending downward from the lower surface of the card body 181. The above-described multiple electrodes provided on the upper surface of the card body 181 are electrically connected to the respective probes 182. During test, the probes 182 are in contact with electrode pads and solder bumps in the electronic device formed on the substrate W. Therefore, during the electrical characteristic test, an electrical signal related to the test is transmitted and received between the tester motherboard 141 and the electronic device on the substrate W through the pogo pin, the electrodes provided on the upper surface of the card body 181, and the probes 182.

The aligning unit 150 includes a chuck top 151 and an aligner 153. The chuck top 151 is detachably mounted on the aligner 153. The substrate W is placed on the chuck top 151. Additionally, the chuck top 151 adsorbs the placed substrate W. The chuck top 151 is provided with a temperature adjust mechanism 152. The temperature adjust mechanism 152 adjusts the temperature of the chuck top 151 during the electrical characteristic test. By the temperature adjust mechanism 152 adjusting the temperature, the temperature of the substrate W placed on the chuck top 151 during the electrical characteristic test can be adjusted to, for example, −30° C. to +130° C.

Additionally, the aligner 153 supports the chuck top 151 and moves the chuck top 151 in the up-down direction, the front-rear direction, and the left-right direction in FIG. 3 and FIG. 4.

The aligning unit 150 aligns the substrate W on the chuck top 151 such that the substrate W on the chuck top 151 is in contact with the probe 182 of the probe card 180. Additionally, after the aligning, a sealed space including the probe card 180 and the substrate W is formed, and the sealed space is vacuumed by a vacuum mechanism (not illustrated). At this time, by moving the aligner 153 downward, the chuck top 151 is separated from the aligner 153 and is suctioned on the pogo frame 170 side.

<Chuck Top>

Figure 5:
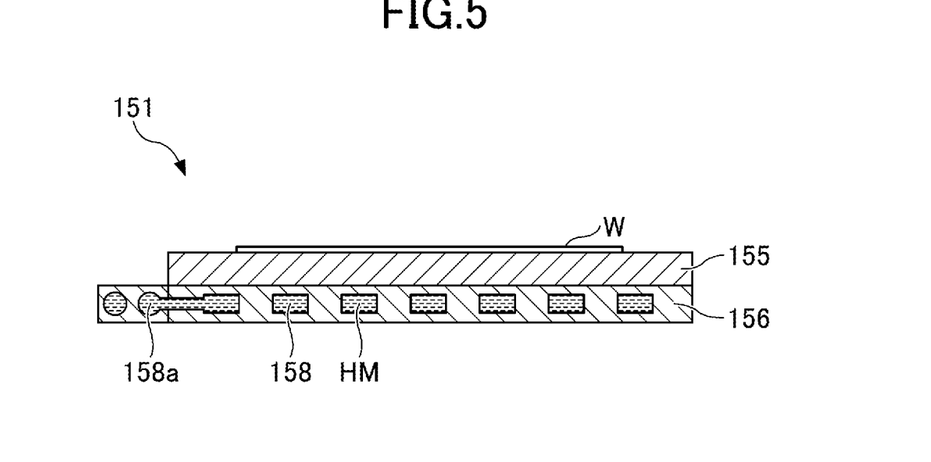
FIG. 5 is a cross-sectional view illustrating a chuck top of the test system according to the present embodiment in detail.

Next, the chuck top 151 of the test system 100 according to the present embodiment will be described. FIG. 5 is a cross-sectional view illustrating the chuck top 151 of the test system 100 according to the present embodiment in detail. Here, FIG. 5 is a view illustrating a state in which the substrate W is placed on the chuck top 151.

The chuck top 151 of the test system 100 according to the present embodiment includes a top plate 155 and a cooling jacket 156.

The top plate 155 is a member on which the substrate W is placed. The top plate 155 is provided with a mechanism for suctioning the substrate W, such as an electrostatic chuck.

The cooling jacket 156 is a member for adjusting the temperature of the substrate W. A medium flow path 158, through which a temperature adjusting medium HM flows, is formed inside the cooling jacket 156. The medium flow path 158 is spirally formed in a top view, for example. Here, the shape of the medium flow path 158 in the top view is not limited to a spiral shape, but may be, for example, a zigzag shape. The temperature adjusting medium HM introduced into the medium flow path 158 is connected to a refrigerant supply 2, which will be described later, through an inlet/outlet pipe 158a provided outside the cooling jacket 156. Here, a heater may be separately provided as the member for adjusting the temperature. The temperature adjusting medium HM is a medium for adjusting the temperature of the substrate W. The temperature adjusting medium HM is, for example, water, brine, or the like. The temperature adjusting medium HM may be used to cool the substrate W or to heat the substrate W.

First Embodiment

<Test System S1>

Figure 6:
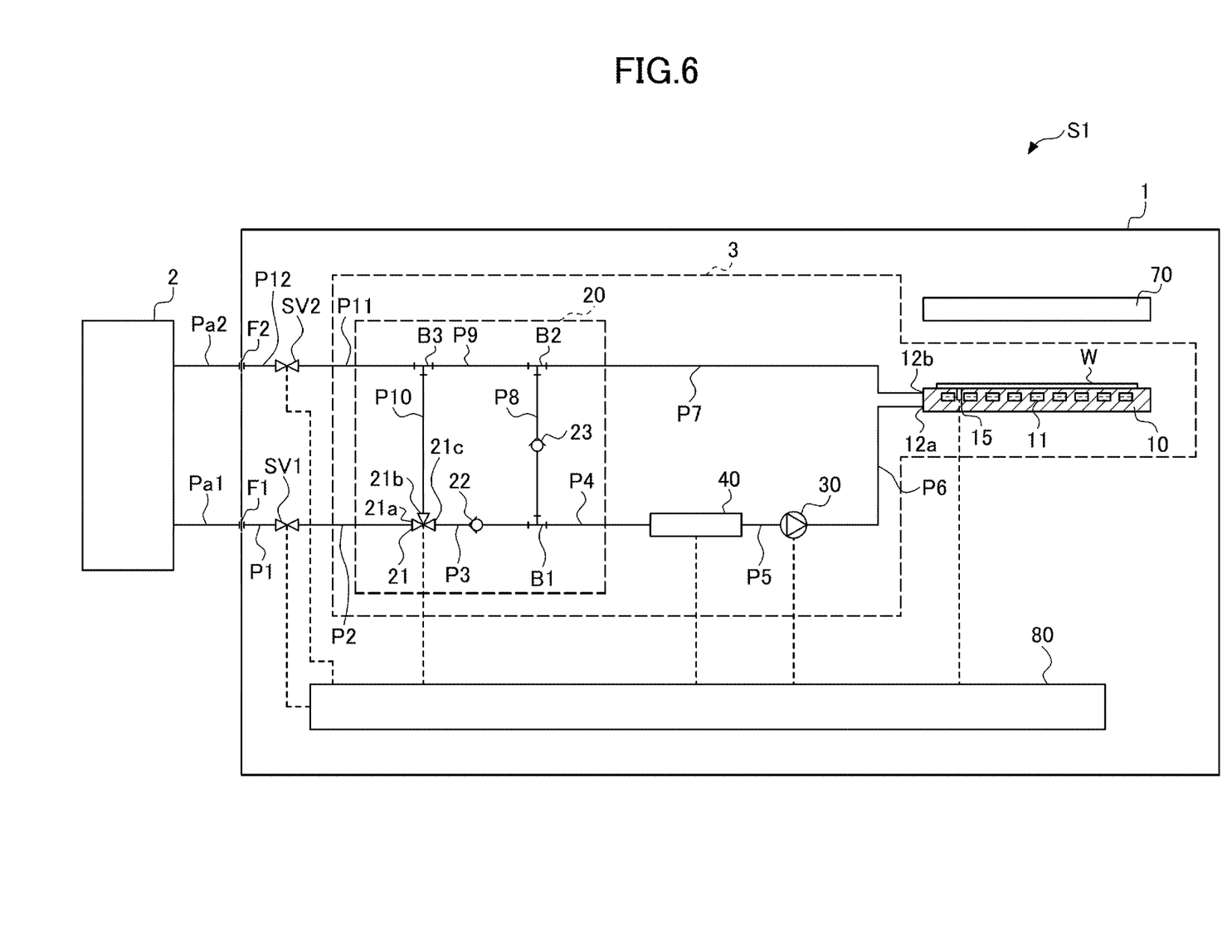
FIG. 6 is a diagram schematically illustrating a support device of a test system according to a first embodiment.

A test system S1, which is an example of a test system according to a first embodiment, will be described. The test system S1 according to the first embodiment will be described by extracting the essential parts of the test system S1 according to the first embodiment from the configuration of the test system 100. FIG. 6 is a diagram schematically illustrating the test system S1, which is an example of the test system according to the first embodiment.

The test system S1 performs an electrical test on the substrate W in a state in which the temperature is adjusted. The test system S1 includes a test device 1 and the refrigerant supply 2. The test system S1 has a one-to-one correspondence between the number of the cells for testing, that is, the number of the supports 10, and the number of the refrigerant supplies 2.

The test device 1 performs an electrical test on the substrate W. The refrigerant supply 2 supplies, to the test device 1, the temperature adjusting medium whose temperature is adjusted.

[Test Device 1]

The test device 1 includes a support device 3, a testing unit 70, and a controller 80. The support device 3 supports a substrate W to be tested while being placed on the support device 3. The testing unit 70 performs an electrical test on the substrate W supported by the support device 3.

The temperature adjusting medium is supplied from the refrigerant supply 2 to the test device 1 and recovered. The refrigerant supply 2 is connected to a pipe P1 by connecting a pipe Pa1 to a joint F1. The refrigerant supply 2 supplies the temperature adjusting medium to the test device 1 through the pipe Pa1. The pipe P1 is connected to a pipe P2 through a stop valve SV1. Additionally, the refrigerant supply 2 connects a pipe Pa2 to a joint F2 to be connected to a pipe P12. The refrigerant supply 2 recovers the temperature adjusting medium from the test device 1 through the pipe Pa2. The pipe P12 is connected to a pipe P11 through a stop valve SV2. Here, the stop valve SV1 and the stop valve SV2 are controlled by the controller 80. Each element will be described below.

(Support Device 3)

The support device 3 holds the substrate W while adjusting the temperature such that the temperature of the substrate W to be tested becomes a desired temperature. The support device 3 includes a support 10, a mixer 20, a medium transfer section (a medium transfer) 30, and a heater 40.

(Support 10)

The substrate W to be tested is placed on the support 10 and held by the support 10. The support 10 is, for example, the chuck top 151 in the test system 100. The support 10 has a flow path 11 (a medium flow path) inside. The support 10 has an inlet 12a into which the temperature adjusting medium flows and an outlet 12b from which the temperature adjusting medium flows out. The temperature adjusting medium flows through the flow path 11 such that the temperature adjusting medium flows into the inlet 12a and flows out from the outlet 12b.

The temperature adjusting medium flows inside the support 10 to exchange heat with the substrate W, thereby adjusting the temperature of the substrate W to a desired temperature.

Additionally, the support 10 includes a temperature measuring element 15. The temperature measuring element 15 measures the temperature of the support 10. A result measured by the temperature measuring element 15 is input to the controller 80. The controller 80 performs control such that the temperature measured by the temperature measuring element 15 becomes a desired temperature.

(Mixer 20)

The mixer 20 discharges, to the medium transfer 30, a temperature adjusting medium in which the temperature adjusting medium supplied from the outside of the test device 1, specifically from the refrigerant supply 2, and the temperature adjusting medium flowing out from the outlet 12b of the support 10 are mixed.

The mixer 20 includes a three-way valve 21, a branch pipe B1, a branch pipe B2, and a branch pipe B3. Each of the branch pipe B1, the branch pipe B2, and the branch pipe B3 is branched in three directions.

The three-way valve 21 includes an inlet 21a into which the temperature adjusting medium supplied from the refrigerant supply 2 flows, a first outlet 21b that causes the temperature adjusting medium to flow out into a path for the refrigerant supply 2 recovering the temperature adjusting medium, and a second outlet 21c that causes the temperature adjusting medium to flow out into a path for flowing into the support 10.

The pipe P2 through which the temperature adjusting medium supplied from the refrigerant supply 2 flows is connected to the inlet 21a of the three-way valve 21. A pipe P10 connected to the branch pipe B3 is connected to the first outlet 21b of the three-way valve 21. A pipe P3 connected to the branch pipe B1 is connected to the second outlet 21c of the three-way valve 21. Here, a check valve 22 is provided in the pipe P3 so that the temperature adjusting medium flows from the three-way valve 21 to the branch pipe B1 and does not flow from the branch pipe B1 to the three-way valve 21.

The branch pipe B1 is connected to the pipe P3 as described above, a pipe P4 that is a path through which the temperature adjusting medium flows to the support 10, and a pipe P8 connected to the branch pipe B2. Here, a check valve 23 is provided in the pipe P8 so that the temperature adjusting medium flows from the branch pipe B2 to the branch pipe B1 and does not flow from the branch pipe B1 to the branch pipe B2.

The branch pipe B2 is connected to a pipe P7 through which the temperature adjusting medium flowing out from the support 10 flows, the pipe P8 as described above, and a pipe P9 connected to the branch pipe B3. The branch pipe B3 is connected to the pipe P9, the pipe P10, and the pipe P11 through which the temperature adjusting medium flows to the refrigerant supply 2, as described above.

By adjusting the degree of the opening, the three-way valve 21 can control the distribution ratio between the amount of the temperature adjusting medium flowing out from the inlet 21a to the first outlet 21b and the amount of the temperature adjusting medium flowing out from the inlet 21a to the second outlet 21c. The three-way valve 21 is connected to the controller 80. The controller 80 controls the three-way valve 21 such that the degree of the opening of the three-way valve 21 becomes a desired degree of the opening. By the controller 80 controlling the degree of the opening of the three-way valve 21, the ratio between the amount of the temperature adjusting medium flowing out from the inlet 21a to the first outlet 21b and the amount of the temperature adjusting medium flowing out from the inlet 21a to the second outlet 21c can be controlled to a desired ratio.

(Medium Transfer 30)

The medium transfer 30 causes the temperature adjusting medium flowing in from the piping P5 to flow through the piping P6. The medium transfer 30 is, for example, a pump. The medium transfer 30 causes the temperature adjusting medium flowing out from the mixer 20 to flow into the inlet 12a of the support 10. The type of the pump used in the medium transfer 30 is not particularly limited, and is, for example, an axial flow pump.

The medium transfer 30 is connected to the controller 80. The controller 80 controls the flow rate at which the temperature adjusting medium is caused to flow by the medium transfer 30 to flow. When the medium transfer 30 is a rotary pump, the controller 80 controls the number of revolutions of the pump. Here, a separate valve may be provided to control the flow rate.

(Heater 40)

The heater 40 heats the temperature adjusting medium. The heater 40 is, for example, a hot wire heater. The heater 40 is connected to the controller 80. The controller 80 controls the heat amount of the heater 40. For example, when the heater 40 is a hot wire heater, the electric power supplied to the hot wire heater is controlled to control the amount of heat generated from the hot wire heater.

(Testing Unit 70)

The testing unit 70 electrically tests the substrate W. The testing unit 70 is, for example, the tester 140 and the probe card 180 in the test system 100. The testing unit 70 includes, for example, a test probe. The testing unit 70 electrically tests the substrate W by causing the probe to come in contact with the substrate W.

(Controller 80)

The controller 80 controls the test device 1. The controller 80 is implemented by a computer including an arithmetic unit and a storage unit. The controller 80 controls respective units of the test device 1. The arithmetic unit includes, for example, a central processing unit (CPU). The storage unit includes, for example, a random access memory (RAM), a read only memory (ROM), a hard disk drive (HDD), a solid state drive (SSD), or a combination thereof.

The storage unit stores a program in which a group of steps (instructions) for executing an operation necessary for test processing is configured. The program includes, for example, a group of steps configured to control the operations of the three-way valve 21 of the mixer 20, the medium transfer 30, and the heater 40 to adjust the temperature of the substrate W, more specifically, adjust the temperature of the temperature measuring element 15 to a desired temperature. The program is stored in a storage medium such as, for example, a hard disk drive, a compact disc, a magneto-optical disk, a memory card, or the like, and is installed in the computer from the storage medium.

For example, the controller 80 controls the degree of the opening of the three-way valve 21 such that the temperature of the temperature measuring element 15 of the support 10 becomes a desired temperature. The controller 80 controls the degree of the opening of the three-way valve 21 to control the mixing ratio of the temperature adjusting medium discharged from the support 10 to the temperature adjusting medium supplied from the refrigerant supply 2. As described above, the controller 80 performs the control method according to the present embodiment.

[Refrigerant Supply 2]

The refrigerant supply 2 supplies the temperature adjusting medium of a predetermined temperature to the test device 1. The refrigerant supply 2 may be, for example, a chiller. The temperature of the temperature adjusting medium supplied by the refrigerant supply 2 is lower than that of the temperature adjusting medium flowing through the support 10.

The refrigerant supply 2 supplies the temperature adjusting medium to the test device 1 by connecting the pipe Pa1 to the joint F1. Additionally, the refrigerant supply 2 recovers the temperature adjusting medium from the test device 1 by connecting the pipe Pa2 to the joint F2.

<Flow of the Temperature Adjusting Medium in the Test System S1>

Figure 7:
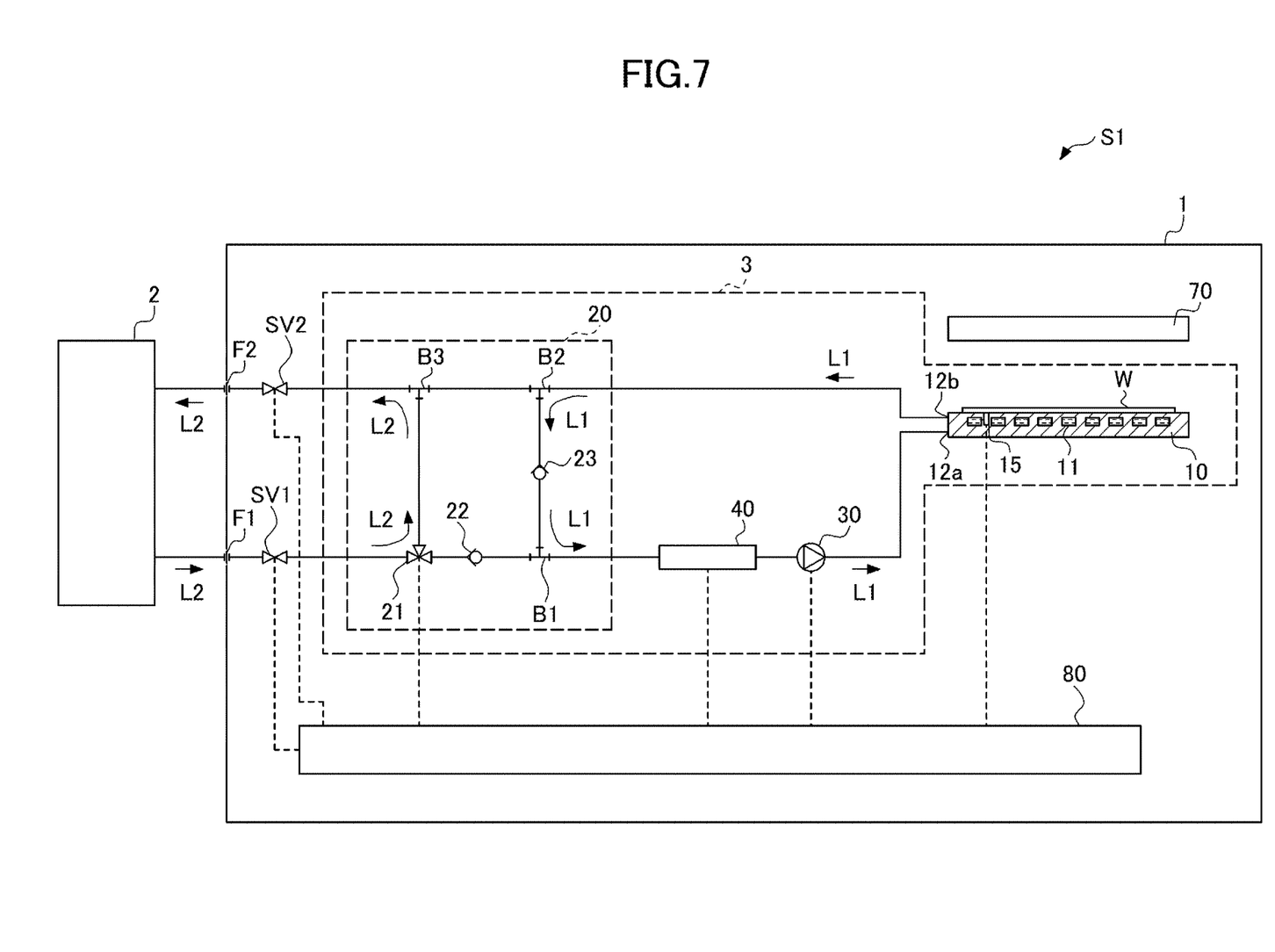
FIG. 7 is a diagram illustrating a flow of a temperature adjusting medium of the test system according to the first embodiment.
Figure 8:
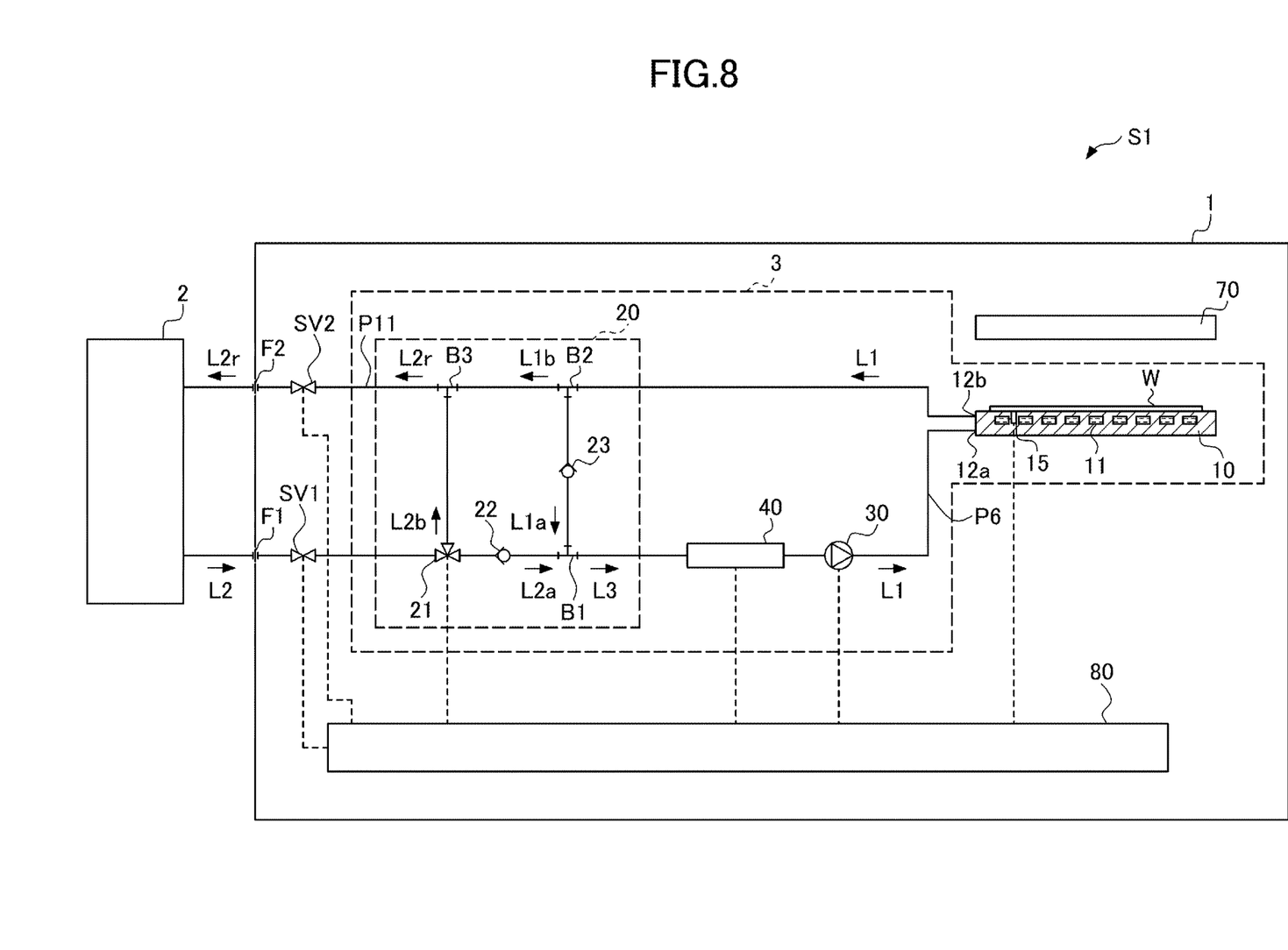
FIG. 8 is a diagram illustrating the flow of the temperature adjusting medium of the test system according to the first embodiment.

The flow of the temperature adjusting medium in the test system S1 will be described. FIG. 7 and FIG. 8 are diagrams illustrating the flow of the temperature adjusting medium in the test system S1 according to the first embodiment.

The test system S1 has two modes, i.e., a heating mode and a cooling mode. Each mode will be described below.

(Heating Mode)

The heating mode is used, for example, when the substrate W does not generate heat and does not need to be cooled. FIG. 7 illustrates the flow of the temperature adjusting medium in the heating mode. In the heating mode, the temperature adjusting medium flowing through the support 10 (hereinafter referred to as a first temperature adjusting medium L1) is circulated by the medium transfer 30. Additionally, in the heating mode, the temperature control medium supplied from the refrigerant supply 2 (hereinafter referred to as a second temperature adjusting medium L2) is all returned to the refrigerant supply 2.

Specifically, in the three-way valve 21 of the mixer 20, the second temperature adjusting medium L2 is prevented from flowing to the support 10 side. In the three-way valve 21 of the mixer 20, the second temperature adjusting medium L2 is all returned to the refrigerant supply 2. That is, in the three-way valve 21, the ratio of the second temperature adjusting medium L2 flowing in the branch pipe B1 is set to 0.

The heater 40 heats the first temperature adjusting medium L1 discharged from the mixer 20. The heated first temperature adjusting medium L1 is transferred to the support 10 by the medium transfer 30.

(Cooling Mode)

The cooling mode is used, for example, when the substrate W generates heat caused by the test and needs to be cooled. FIG. 8 illustrates the flow of the temperature adjusting medium in the cooling mode. In the cooling mode, in the mixer 20, a third temperature adjusting medium L3 in which a part of the first temperature adjusting medium L1 flowing out from the support 10 (a first temperature adjusting medium L1a) is mixed with a part of the second temperature adjusting medium L2 supplied from the refrigerant supply 2 (a second temperature adjusting medium L2a) is discharged to the medium transfer 30.

The heater 40 heats the third temperature adjusting medium L3 discharged from the mixer 20. The heated third temperature adjusting medium L3 is transferred to the support 10 as the first temperature adjusting medium L1 by the medium transfer 30.

Specifically, in the three-way valve 21 of the mixer 20, the second temperature adjusting medium L2a, which is a part of the second temperature adjusting medium L2, flows to the support 10 side. In the second temperature adjusting medium L2, a remaining second temperature adjusting medium L2b that does not flow to the support 10 side flows to the branch pipe B3. In the branch pipe B2, the first temperature adjusting medium L1a, which is a part of the first temperature adjusting medium L1, flows to the branch pipe B1 side. In the first temperature adjusting medium L1, a first temperature adjusting medium L1b that does not flow from the branch pipe B2 to the branch pipe B1 side flows to the branch pipe B3 side. Here, the amount of a first temperature adjusting medium L1b is equal to the amount of the second temperature adjusting medium L2a.

In the branch pipe B1, the first temperature adjusting medium L1a and the second temperature adjusting medium L2a are mixed. The third temperature adjusting medium L3, in which the first temperature adjusting medium L1a and the second temperature adjusting medium L2a are mixed, flows to the medium transfer 30 side. In the test device 1, the third temperature adjusting medium L3 is heated by the heater 40 and transferred from the medium transfer 30 to the support 10.

In the branch pipe B3, the first temperature adjusting medium L1b and the second temperature adjusting medium L2b are mixed. A temperature adjusting medium L2r, in which the first temperature adjusting medium L1b and the second temperature adjusting medium L2b are mixed, is recovered by the refrigerant supply 2.

When the temperature of the support 10 is higher relative to a desired temperature (a target temperature), the controller 80 controls the ratio such that the proportion of the second temperature adjusting medium L2a increases.

Although the heating mode and the cooling mode have been described separately in the above description, the heating mode may be a case in which the third temperature adjusting medium L3, in which the proportion of the second temperature adjusting medium L2 flowing through the branch pipe B1 in the three-way valve 21 of the mixer 20 is set to 0, is discharged from the mixer 20 in the cooling mode. In this case, the third temperature adjusting medium L3, in which the proportion of the second temperature adjusting medium L2 flowing through the branch pipe B1 in the three-way valve 21 of the mixer 20 is set to 0, is equal to the first temperature adjusting medium L1.

<Effects>

According to the test system S1 according to the first embodiment, the temperature of the support supporting the substrate to be tested can be flexibly controlled.

According to the test system S1, by controlling the heater 40 and the three-way valve 21 to control the temperature of the substrate W, the temperature of the temperature adjusting medium flowing through the support 10 can be controlled when the temperature of the support 10 supporting the substrate W to be tested is controlled. In the refrigerant supply 2, which is the chiller, a constant flow rate is desirable in order to keep the temperature of the temperature adjusting medium constant. According to the test system S1, because the flow rate of the temperature adjusting medium supplied from the refrigerant supply 2 is constant regardless of the target temperature of the support 10, the temperature of the temperature adjusting medium supplied from the refrigerant supply 2 can be stabilized. Additionally, according to the test system S1, because the temperature adjusting medium is heated by the heater 40, the temperature of the temperature adjusting medium can be controlled at a high response speed.

Additionally, according to the test system S1, by controlling the medium transfer 30 to control the temperature of the substrate W, the flow rate of the temperature adjusting medium flowing through the support 10 can be controlled when the temperature of the support 10 supporting the substrate W to be tested is controlled. According to the test system S1, by controlling the flow rate of the temperature adjusting medium, the heat amount transmitted from the temperature adjusting medium to the support 10 per unit time can be controlled. Therefore, according to the test system S1, the response speed of the temperature of the support 10 per unit time can be controlled.

For example, in general, the temperature control of the support supporting the substrate W to be tested maintains the temperature of the supplied temperature adjusting medium constant and controls the flow rate of the temperature adjusting medium. When the temperature of the temperature adjusting medium is changed by the chiller, the response speed may be slow. Additionally, when the flow rate of the chiller changes, the temperature of the temperature adjusting medium may be unstable. According to the test system S1 according to the present embodiment, the temperature can be stably controlled and the control can be performed in consideration of the response speed.

Second Embodiment

<Test System S2>

Figure 9:
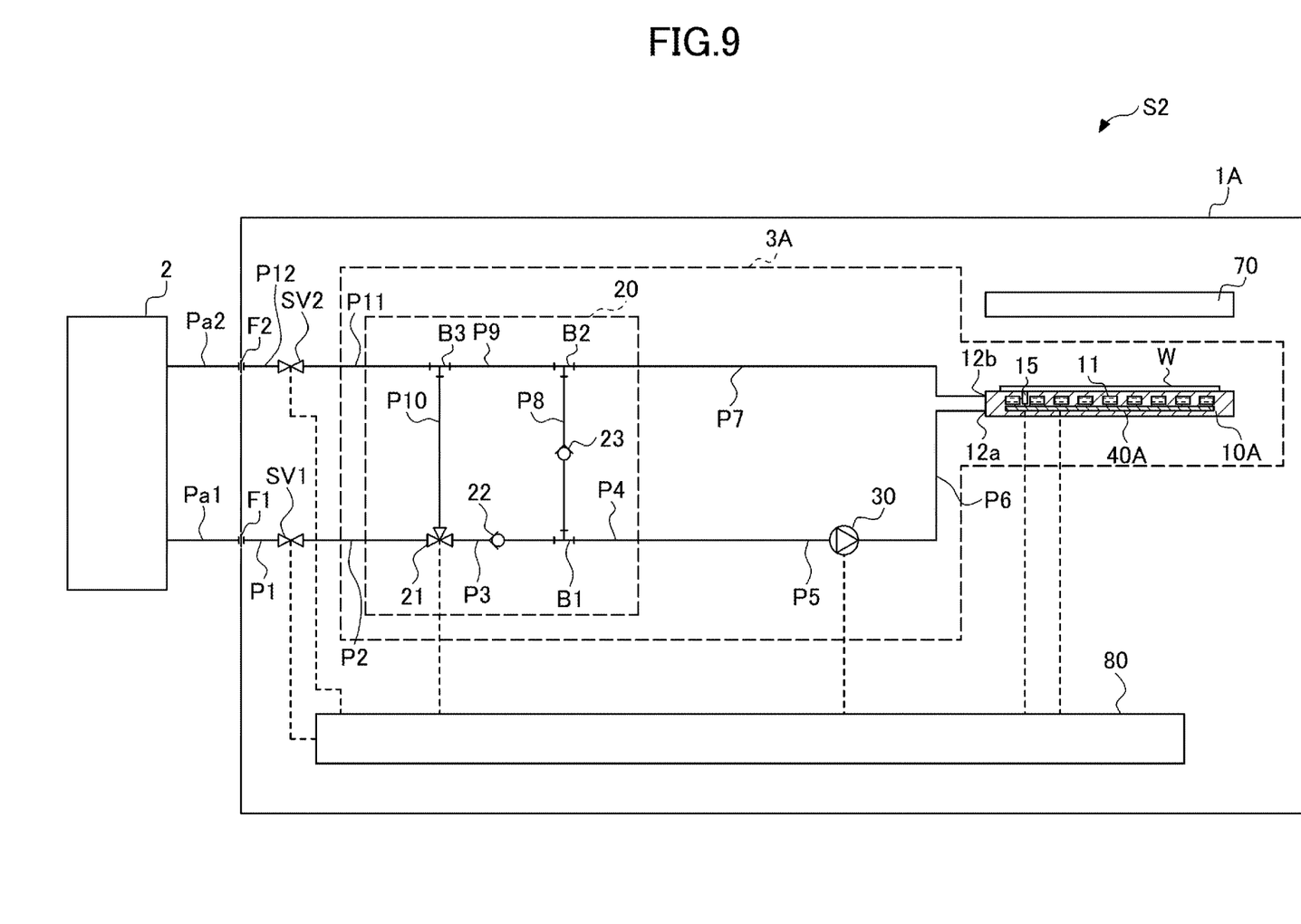
FIG. 9 is a diagram schematically illustrating a support device of a test system according to a second embodiment.

In the test system S1 according to the first embodiment, the heater 40 is provided separately from the support 10, but the heater may be provided inside the support. A test system S2 according to a second embodiment includes a test device 1A including a support device 3A, instead of the test device 1.

The support device 3A includes a support 10A instead of the support 10 of the support device 3 according to the first embodiment. Additionally, the support device 3A includes a heater 40A provided inside the support 10A instead of the heater 40 of the support device 3 according to the first embodiment.

The test system S2, which is an example of the test system according to the second embodiment, will be described. FIG. 9 is a diagram schematically illustrating the test system S2, which is an example of a test system according to the second embodiment.

(Support 10A)

The substrate W to be tested is placed on the support 10A and held by the support 10A. The support 10A has the flow path 11 inside. The support 10A has the inlet 12a into which the temperature adjusting medium flows and the outlet 12*b* from which the temperature adjusting medium flows out. The temperature adjusting medium flows through the flow path 11 such that the temperature adjusting medium flows into the inlet 12*a* and flows out from the outlet 12*b*.

The support 10A includes the heater 40A inside. The heater 40A heats the first temperature adjusting medium L1. The heater 40A heats the support 10A and also heats the temperature adjusting medium. The heater 40A is, for example, a hot wire heater. The heater 40A is connected to the controller 80. The controller 80 controls the heat amount of the heater 40A. The temperature adjusting medium flows into the support 10A, the temperature adjusting medium is heated by the heater 40A, and heat is exchanged between the substrate W and the temperature adjusting medium, so that the temperature of the substrate W is controlled to a desired temperature.

<Effects>

According to the test system S2 according to the second embodiment, in addition to the effects of the test system S1 according to the first embodiment, the scale of the system can be reduced by integrating the heater with the support.

Here, although the heater is not provided outside the support 10 in the test system S2 according to the second embodiment, a heater that heats the temperature adjusting medium may be further provided outside the support 10, separately from the heater 40A provided inside the support 10.

Third Embodiment

<Test System S3>

Figure 10:
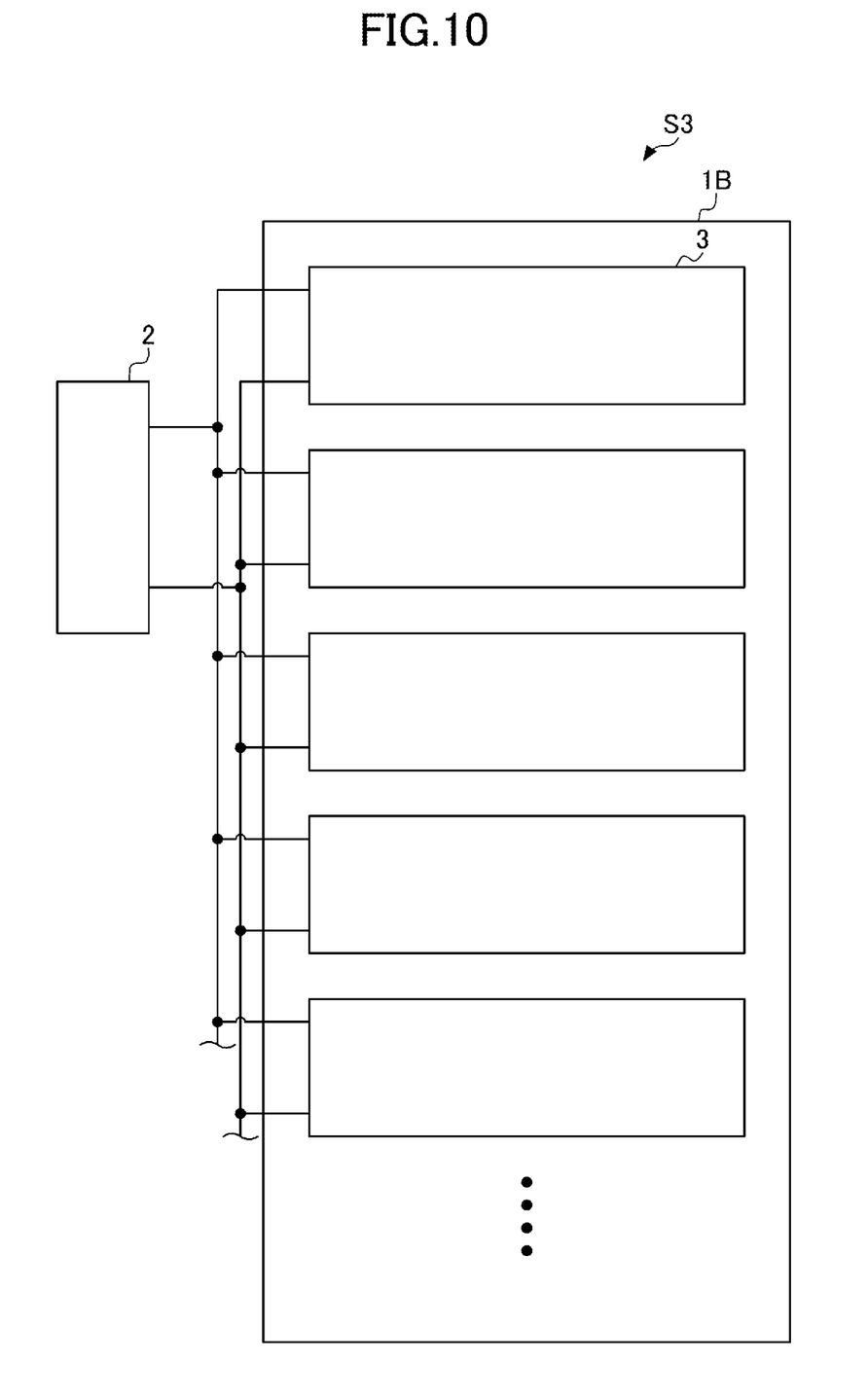
FIG. 10 is a diagram schematically illustrating a test system according to a third embodiment.

In the test system S1 according to the first embodiment, the support device 3 and the refrigerant supply 2 have a one-to-one relationship, but multiple support devices 3 may be provided for one refrigerant supply 2. A test system S3 according to a third embodiment includes a test device 1B including multiple support devices 3, instead of the test device 1. That is, the test system S3 includes multiple support devices 3. The test system S3 is what is called a multi-cell test system. FIG. 10 is a diagram schematically illustrating the test system S3 according to the third embodiment.

The test device 1B of the test system S3 according to the third embodiment includes multiple support devices 3 for one refrigerant supply 2. The temperature adjusting medium supplied from the refrigerant supply 2 is branched by piping and is supplied to each of the multiple support devices 3. Additionally, the temperature adjusting medium discharged from each of the multiple support devices 3 is merged from the branched piping and is recovered by the refrigerant supply 2.

Here, in the test system S3, the support device 3A included in the test system S2 according to the second embodiment may be used instead of the support device 3.

<Effects>

According to the test system S3 according to the third embodiment, in addition to the effects of the test system S1 according to the first embodiment, the temperature can be individually controlled in each of the multiple support devices 3. That is, according to the test system S3, the test can be performed under different temperature conditions in the multiple test devices.

For example, in a multi-cell test system including multiple testers, such as the test system 100, if the temperature adjusting medium is supplied from one refrigerant supply to multiple test devices, all of the multiple test devices can be tested under only the same temperature condition. According to the test system S3 according to the present embodiment, because each of the multiple support devices 3 includes the mixer 20, the medium transfer 30, and the heater 40, the temperature can be individually controlled in each of the multiple testers. Therefore, according to the test system S3, the test can be performed under different temperature conditions in the multiple testers.

According to the test system S3, because the total flow rate of the temperature adjusting medium supplied from the refrigerant supply 2 to the respective test devices 1B is constant regardless of the target temperature of the support 10 in each of the support devices 3, the temperature of the temperature adjusting medium supplied from the refrigerant supply 2 can be stabilized.

The present disclosure provides a test system that can flexibly control the temperature of a support that supports a substrate to be tested.

The support device, the test system, and the control method of the support device according to the present embodiment disclosed herein should be considered to be exemplary and not restrictive in all respects. The above-described embodiments can be modified and improved in various forms without departing from the scope of claims and the spirit thereof. The matters described in the above-described embodiments may be other configurations to the extent that they are not inconsistent, and may be combined to the extent that they are not inconsistent.

What is claimed is:

1. A support device comprising:
a support that supports an object to be tested and that includes a flow path inside, the flow path having an inlet and an outlet, and the flow path being configured to flow a first temperature adjusting medium from the inlet to the outlet;
a mixer configured to discharge a third temperature adjusting medium, the first temperature adjusting medium flowing out from the outlet and a second temperature adjusting medium externally supplied being mixed at a ratio that is predetermined in the third temperature adjusting medium;
a medium transfer configured to transfer the third temperature adjusting medium to the inlet as the first temperature adjusting medium; and
a heater configured to heat the first temperature adjusting medium or the third temperature adjusting medium.

2. The support device as claimed in claim 1, further comprising a controller, wherein the controller controls the ratio in accordance with a temperature of the support.

3. The support device as claimed in claim 2,
wherein a temperature of the second temperature adjusting medium is lower than a temperature of the first temperature adjusting medium, and
wherein the controller controls the ratio such that a proportion of the second temperature adjusting medium is increased, upon detecting that the temperature of the support exceeds a target temperature.

4. The support device as claimed in claim 3, wherein the controller controls the proportion of the second temperature adjusting medium such that the proportion of the second temperature adjusting medium is zero.

5. The support device as claimed in claim 2, wherein the controller controls a heating amount of the heater and a flow amount of the medium transfer.

6. The support device as claimed in claim 2,
wherein the mixer has a three-way valve, and
wherein the three-way valve distributes an externally supplied temperature adjusting medium to a path for externally discharging and to a path leading to the medium transfer, and
wherein the controller controls a degree of an opening of the three-way valve.

7. The support device as claimed in claim 1,
wherein the mixer includes a three-way valve, and
wherein the three-way valve distributes an externally supplied temperature adjusting medium to a path for externally discharging and to a path leading to the medium transfer.

8. The support device as claimed in claim 1,
wherein the heater is included inside the support.

9. A test system comprising:
a refrigerant supply; and
a plurality of support devices as claimed in claim 1;
wherein the refrigerant supply supplies the second temperature adjusting medium to each of the plurality of support devices.

10. A method of controlling a support device including:
a support that supports an object to be tested and that has a flow path inside, a first temperature adjusting medium flowing through the flow path from an inlet to an outlet;
a heater configured to heat the first temperature adjusting medium;
a mixer configured to discharge a third temperature adjusting medium in which the first temperature adjusting medium flowing out from the outlet and a second temperature adjusting medium that is externally supplied are mixed, at a ratio that is predetermined; and
a medium transfer configured to transfer the third temperature adjusting medium to the inlet as the first temperature adjusting medium, the method comprising controlling the ratio in accordance with a temperature of the support.

* * * * *